(12) United States Patent
Sun et al.

(10) Patent No.: US 12,543,430 B2
(45) Date of Patent: Feb. 3, 2026

(54) LIGHT EMITTING DIODE DEVICE, PREPARATION METHOD THEREFOR, LIGHT EMITTING SUBSTRATE, AND LIGHT EMITTING APPARATUS

(71) Applicant: BOE Technology Group Co., Ltd., Beijing (CN)

(72) Inventors: Haiyan Sun, Beijing (CN); Xiaojin Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 354 days.

(21) Appl. No.: 18/271,058

(22) PCT Filed: Jul. 1, 2022

(86) PCT No.: PCT/CN2022/103442
§ 371 (c)(1),
(2) Date: Jul. 6, 2023

(87) PCT Pub. No.: WO2023/005607
PCT Pub. Date: Feb. 2, 2023

(65) Prior Publication Data
US 2024/0306415 A1    Sep. 12, 2024

(30) Foreign Application Priority Data
Jul. 30, 2021  (CN) .......................... 202110876286.X

(51) Int. Cl.
H10K 50/15 (2023.01)
H10K 50/115 (2023.01)
(Continued)

(52) U.S. Cl.
CPC ........... H10K 50/15 (2023.02); H10K 50/115 (2023.02); H10K 50/16 (2023.02); H10K 71/12 (2023.02);
(Continued)

(58) Field of Classification Search
CPC ...... H10K 50/15; H10K 50/115; H10K 50/16; H10K 71/12; H10K 71/60; H10K 85/6572;
(Continued)

(56) References Cited

U.S. PATENT DOCUMENTS 11,653,512 B2 *  5/2023  Lee .................... H10K 85/1135
                                                257/40
11,997,862 B2 *  5/2024  Heo ........................ H10K 59/35
(Continued)

FOREIGN PATENT DOCUMENTS

CN          1586095 A      2/2005
CN          1871877 A     11/2006
(Continued)

*Primary Examiner* — David Vu
(74) *Attorney, Agent, or Firm* — WHDA, LLP

(57) ABSTRACT

A light-emitting-diode device and a fabricating method thereof, a light emitting base plate and a light emitting apparatus. The light-emitting-diode device includes: an anode layer, a luminescent layer, a charge-carrier balancing layer, an electron transporting layer and a cathode layer that are arranged in stack; and a hole mobility of the charge-carrier balancing layer is greater than an electron mobility of the charge-carrier balancing layer, an LUMO energy level of the charge-carrier balancing layer is shallower than an LUMO energy level of the electron transporting layer, and an HOMO energy level of the charge-carrier balancing layer is shallower than an HOMO energy level of the luminescent layer.

20 Claims, 3 Drawing Sheets

(51) Int. Cl.
  *H10K 50/16* (2023.01)
  *H10K 71/12* (2023.01)
  *H10K 71/60* (2023.01)
  *H10K 85/60* (2023.01)
  *H10K 101/30* (2023.01)
  *H10K 101/40* (2023.01)
  *H10K 102/00* (2023.01)

(52) U.S. Cl.
  CPC ......... *H10K 71/60* (2023.02); *H10K 85/6572* (2023.02); *H10K 2101/30* (2023.02); *H10K 2101/40* (2023.02); *H10K 2102/351* (2023.02)

(58) Field of Classification Search
  CPC .......... H10K 2101/30; H10K 2101/40; H10K 2102/351; H10K 50/11; H10K 50/165; H10K 50/18; H10K 71/00
  See application file for complete search history.

(56) References Cited

U.S. PATENT DOCUMENTS

| | | |
|---|---|---|
| 2004/0245542 A1 | 12/2004 | Kim |
| 2006/0227079 A1 | 10/2006 | Kashiwabara |
| 2007/0116983 A1 | 5/2007 | Kanno et al. |
| 2013/0207082 A1 | 8/2013 | Cho et al. |
| 2020/0185604 A1 | 6/2020 | Grigg et al. |
| 2021/0013422 A1 | 1/2021 | Heo et al. |
| 2021/0163411 A1 | 6/2021 | Li et al. |

FOREIGN PATENT DOCUMENTS

| | | |
|---|---|---|
| CN | 103247761 A | 8/2013 |
| CN | 103904178 A | 7/2014 |
| CN | 109509842 A | 3/2019 |
| CN | 109844979 A | 6/2019 |
| CN | 110317206 A | 10/2019 |
| CN | 110577511 A | 12/2019 |
| CN | 110622332 A | 12/2019 |
| CN | 110642820 A | 1/2020 |
| CN | 110885335 A | 3/2020 |
| EP | 2629346 A2 | 8/2013 |
| KR | 20190080558 A | 7/2019 |

* cited by examiner

LIGHT EMITTING DIODE DEVICE, PREPARATION METHOD THEREFOR, LIGHT EMITTING SUBSTRATE, AND LIGHT EMITTING APPARATUS

CROSS REFERENCE TO RELEVANT APPLICATIONS

The present disclosure claims the priority of the Chinese patent application filed on Jul. 30, 2021 before the China National Intellectual Property Administration with the application number of 202110876286.X and the title of "LIGHT EMITTING DIODE DEVICE, PREPARATION METHOD THEREFOR, LIGHT EMITTING SUBSTRATE, AND LIGHT EMITTING APPARATUS", which is incorporated herein in its entirety by reference.

TECHNICAL FIELD

The present disclosure relates to the technical field of photoelectricity, and particularly relates to a light-emitting-diode device and a fabricating method thereof, a light emitting base plate and a light emitting apparatus.

BACKGROUND

Quantum dots (QDs) have the advantages such as a high fluorescent quantum yield, a narrow luminescence spectrum and a regulatable luminescence spectrum, and have a promising application prospect in fields such as displaying. Especially, QDs can be used to fabricate self-luminous Quantum-dot Light-Emitting Diode (QLED) with a low cost and a large area by using a printing technique, and are expected to be one of the mainstream techniques for the next-generation illumination and displaying applications.

SUMMARY

The present disclosure provides a light-emitting-diode device, wherein the light-emitting-diode includes:
an anode layer, a luminescent layer, a charge-carrier balancing layer, an electron transporting layer and a cathode layer that are arranged in stack; and
a hole mobility of the charge-carrier balancing layer is greater than an electron mobility of the charge-carrier balancing layer, an LUMO energy level of the charge-carrier balancing layer is shallower than an LUMO energy level of the electron transporting layer, and a HOMO energy level of the charge-carrier balancing layer is shallower than a HOMO energy level of the luminescent layer.

In an alternative implementation, the HOMO energy level of the charge-carrier balancing layer is shallower than a HOMO energy level of the electron transporting layer.

In an alternative implementation, a difference between the LUMO energy level of the charge-carrier balancing layer and the LUMO energy level of the electron transporting layer is greater than or equal to 0.6 eV, and less than or equal to 1.5 eV.

In an alternative implementation, the electron mobility of the charge-carrier balancing layer is less than an electron mobility of the electron transporting layer by no less than 2 orders of magnitude.

In an alternative implementation, the light-emitting-diode device further includes a hole transporting layer provided between the anode layer and the luminescent layer, and a hole mobility of the hole transporting layer is greater than the hole mobility of the charge-carrier balancing layer by 1 order of magnitude or less than the hole mobility of the charge-carrier balancing layer by 1 order of magnitude.

In an alternative implementation, an absolute value of the LUMO energy level of the charge-carrier balancing layer is greater than or equal to 2.35 eV, and an absolute value of the HOMO energy level of the charge-carrier balancing layer is less than or equal to 6.3 eV.

In an alternative implementation, a material of the charge-carrier balancing layer includes a first compound, wherein the first compound is selected from compounds represented by the following first general formula:

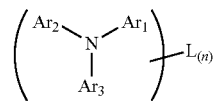

wherein $L_{(n)}$ represents solubilizing groups;
n represents a quantity of the solubilizing groups, wherein n is greater than or equal to 2; and
$Ar_1$, $Ar_2$ and $Ar_3$ are the same or different, and at least one of $Ar_1$, $Ar_2$ and $Ar_3$ is selected from compounds represented by a second general formula, and the other are selected from compounds represented by a third general formula;
the second general formula is:

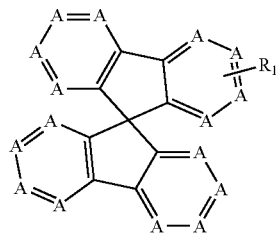

wherein A is selected from nitrogen or carbon; and
the third general formula is any one of the following general formulas:

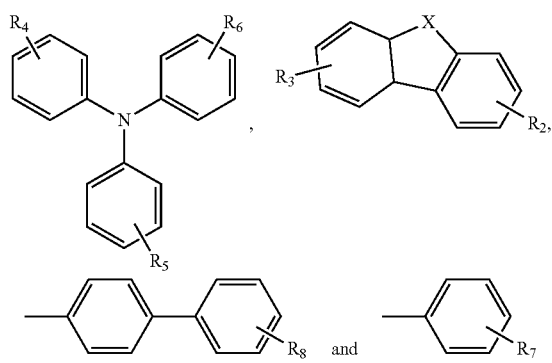

wherein X is selected from N, C, O or S; and
$R_1$, $R_2$, $R_3$, $R_4$, $R_5$, $R_6$, $R_7$ and $R_8$ are the same or different, and are individually independently selected from any one of substituted alkyl having 1 to 30 carbon atoms, unsubstituted alkyl having 1 to 30 carbon atoms, substituted alkoxy having 1 to 30 carbon atoms, unsubstituted alkoxy having 1 to 30 carbon atoms, aryl having 6 to 40 carbon atoms, aryloxy having 6 to 40 carbon atoms and aralkyl having 7 to 40 carbon atoms.

In an alternative implementation, the solubilizing groups are selected from any one of straight-chain alkyl having 2 to 40 carbon atoms, branch-chain alkyl having 2 to 40 carbon atoms, cyclic alkyl having 2 to 40 carbon atoms, straight-chain alkoxy having 2 to 40 carbon atoms, branch-chain alkoxy having 2 to 40 carbon atoms and cyclic alkoxy having 2 to 40 carbon atoms.

In an alternative implementation, a molecular weight of the first compound is less than or equal to 5000 g/mol.

In an alternative implementation, the molecular weight of the first compound is less than or equal to 4000 g/mol.

In an alternative implementation, a thickness of the charge-carrier balancing layer is greater than or equal to 2 micrometers, and less than or equal to 40 micrometers.

In an alternative implementation, the thickness of the charge-carrier balancing layer is greater than or equal to 5 micrometers, and less than or equal to 25 micrometers.

In an alternative implementation, the luminescent layer is a quantum-dot luminescent layer.

The present disclosure provides a light emitting base plate, wherein the light emitting base plate includes:
a substrate, and a plurality of the light-emitting-diode devices according to any one of the above embodiments that are provided on one side of the substrate, wherein the anode layer or the cathode layer is close to the substrate.

The present disclosure provides a light emitting apparatus, wherein the light emitting apparatus includes the light emitting base plate according to any one of the above embodiments.

The present disclosure provides a fabricating method of a light-emitting-diode device, wherein the fabricating method includes:
sequentially forming an anode layer, a luminescent layer, a charge-carrier balancing layer, an electron transporting layer and a cathode layer; or
sequentially forming a cathode layer, an electron transporting layer, a charge-carrier balancing layer, a luminescent layer and an anode layer;
wherein a hole mobility of the charge-carrier balancing layer is greater than an electron mobility of the charge-carrier balancing layer, an LUMO energy level of the charge-carrier balancing layer is shallower than an LUMO energy level of the electron transporting layer, and a HOMO energy level of the charge-carrier balancing layer is shallower than a HOMO energy level of the luminescent layer.

In an alternative implementation, the step of sequentially forming the anode layer, the luminescent layer, the charge-carrier balancing layer, the electron transporting layer and the cathode layer includes:
sequentially forming the anode layer and the luminescent layer;
spin-coating a solution of a first compound onto one side of the luminescent layer that is away from the anode layer, and drying the solution of the first compound, to form the charge-carrier balancing layer; and
sequentially forming the electron transporting layer and the cathode layer on one side of the charge-carrier balancing layer that is away from the anode layer; and
the step of sequentially forming the cathode layer, the electron transporting layer, the charge-carrier balancing layer, the luminescent layer and the anode layer includes:

sequentially forming the cathode layer and the electron transporting layer;
spin-coating the solution of the first compound onto one side of the electron transporting layer that is away from the cathode layer, and drying the solution of the first compound, to form the charge-carrier balancing layer; and
sequentially forming the luminescent layer and the anode layer on one side of the charge-carrier balancing layer that is away from the cathode layer;
wherein the first compound is selected from compounds represented by the following first general formula:

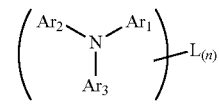

wherein $L_{(n)}$ represents solubilizing groups;
n represents a quantity of the solubilizing groups, wherein n is greater than or equal to 2; and
$Ar_1$, $Ar_2$ and $Ar_3$ are the same or different, and at least one of $Ar_1$, $Ar_2$ and $Ar_3$ is selected from compounds represented by a second general formula, and the other are selected from compounds represented by a third general formula;
the second general formula is:

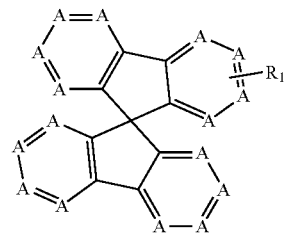

wherein A is selected from nitrogen or carbon; and
the third general formula is any one of the following general formulas:

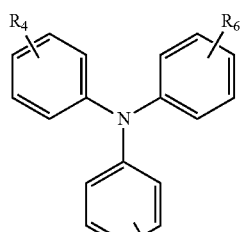

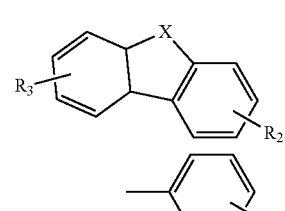

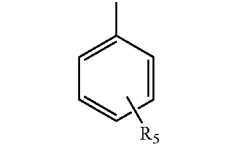

, and

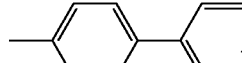

wherein X is selected from N, C, O or S; and
$R_1$, $R_2$, $R_3$, $R_4$, $R_5$, $R_6$, $R_7$ and $R_8$ are the same or different, and are individually independently selected from any one of substituted alkyl having 1 to 30 carbon atoms, unsubstituted alkyl having 1 to 30 carbon atoms, substituted alkoxy having 1 to 30 carbon atoms, unsubstituted alkoxy having 1 to 30 carbon atoms, aryl having 6 to 40 carbon atoms, aryloxy having 6 to 40 carbon atoms and aralkyl having 7 to 40 carbon atoms.

In an alternative implementation, the step of sequentially forming the anode layer and the luminescent layer includes:
forming the anode layer;
forming the hole transporting layer on one side of the anode layer; and
forming the luminescent layer on one side of the hole transporting layer that is away from the anode layer; and the step of sequentially forming the luminescent layer and the anode layer on the one side of the charge-carrier balancing layer that is away from the cathode layer includes:
forming the luminescent layer on one side of the charge-carrier balancing layer that is away from the cathode layer;
forming the hole transporting layer on one side of the luminescent layer that is away from the charge-carrier balancing layer; and
forming the anode layer on one side of the hole transporting layer that is away from the charge-carrier balancing layer;
wherein a hole mobility of the hole transporting layer is greater than the hole mobility of the charge-carrier balancing layer by 1 order of magnitude or less than the hole mobility of the charge-carrier balancing layer by 1 order of magnitude.

The above description is merely a summary of the technical solutions of the present disclosure. In order to more clearly know the elements of the present disclosure to enable the implementation according to the contents of the description, and in order to make the above and other purposes, features and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure or the related art, the figures that are required to describe the embodiments or the related art will be briefly described below. Apparently, the figures that are described below are embodiments of the present disclosure, and a person skilled in the art can obtain other figures according to these figures without paying creative work. It should be noted that the scales in the drawings are merely illustrative and do not indicate the actual scales.

DETAILED DESCRIPTION

In order to make the objects, the technical solutions and the advantages of the embodiments of the present disclosure clearer, the technical solutions of the embodiments of the present disclosure will be clearly and completely described below with reference to the drawings of the embodiments of the present disclosure. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

Figure 1:
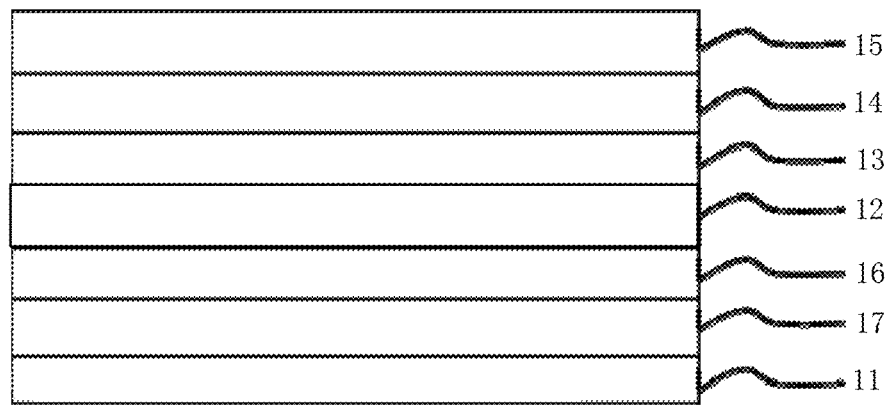
FIG. 1 schematically illustrates a schematic sectional structural diagram of a light-emitting-diode device according to the present disclosure.

An embodiment of the present disclosure provides a light-emitting-diode device. Referring to FIG. 1, FIG. 1 schematically illustrates a schematic sectional structural diagram of a light-emitting-diode device according to the present embodiment. As shown in FIG. 1, the light-emitting-diode device includes: an anode layer 11, a luminescent layer 12, a charge-carrier balancing layer 13, an electron transporting layer 14 and a cathode layer 15 that are arranged in stack.

The hole mobility of the charge-carrier balancing layer 13 is greater than the electron mobility of the charge-carrier balancing layer 13.

Figure 2:
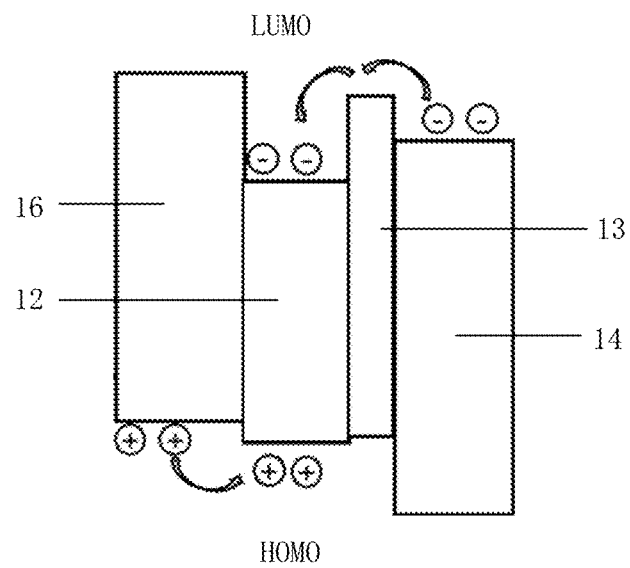
FIG. 2 schematically illustrates a schematic diagram of an energy-level structure of a light-emitting-diode device according to the present disclosure.

Referring to FIG. 2, FIG. 2 schematically illustrates a schematic diagram of an energy-level structure of a light-emitting-diode device according to the present embodiment. As shown in FIG. 2, the LUMO energy level of the charge-carrier balancing layer 13 is shallower than the LUMO energy level of the electron transporting layer 14, and the HOMO energy level of the charge-carrier balancing layer 13 is shallower than the HOMO energy level of the luminescent layer 12.

That the LUMO energy level of the charge-carrier balancing layer 13 is shallower than the LUMO energy level of the electron transporting layer 14 refers to that the LUMO energy level of the charge-carrier balancing layer 13 is higher than the LUMO energy level of the electron transporting layer 14. Because both of the LUMO energy level of the charge-carrier balancing layer 13 and the LUMO energy level of the electron transporting layer 14 are a negative value, the absolute value of the LUMO energy level of the charge-carrier balancing layer 13 is less than the absolute value of the LUMO energy level of the electron transporting layer 14.

That the HOMO energy level of the charge-carrier balancing layer 13 is shallower than the HOMO energy level of the luminescent layer 12 refers to that the HOMO energy level of the charge-carrier balancing layer 13 is higher than the HOMO energy level of the luminescent layer 12. Because both of the HOMO energy level of the charge-carrier balancing layer 13 and the HOMO energy level of the luminescent layer 12 are a negative value, the absolute value of the HOMO energy level of the charge-carrier balancing layer 13 is less than the absolute value of the HOMO energy level of the luminescent layer 12.

Because the LUMO energy level of the charge-carrier balancing layer 13 is shallower than the LUMO energy level of the luminescent layer 12, a barrier potential blocking the electron transportation is formed between the electron transporting layer 14 and the luminescent layer 12, which may reduce the speed of the transportation of the electrons from the electron transporting layer 14 to the luminescent layer 12, whereby the speed of the transportation of the electrons from the electron transporting layer 14 to the luminescent layer 12 is close to the speed of the transportation of the holes from the anode layer 11 to the luminescent layer 12. In an aspect, that may reduce the quantity of the electrons that are not recombined, i.e., the excess electrons, and prevent the excess electrons from accumulating at the surface of one side of the luminescent layer 12 that is close to the anode layer 11, which may improve the characteristic stability of the film layers (for example, the hole transporting layer 16) between the anode layer 11 and the luminescent layer 12, to improve the reliability and the life of the device. In such a case, the charge-carrier balancing layer 13 serves to regulate the balance of the charge carriers. In another aspect, because the speed of the transportation of the electrons from the electron transporting layer 14 to the luminescent layer 12 is reduced, some of the electrons accumulate at the interface between the charge-carrier balancing layer 13 and the luminescent layer 12 and inside the charge-carrier balancing layer 13, and because the hole mobility of the charge-carrier balancing layer 13 is greater than the electron mobility of the charge-carrier balancing layer 13, and the HOMO energy level of the charge-carrier balancing layer 13 is shallower than the HOMO energy level of the luminescent layer 12, all of those factors may cause the holes to migrate to the charge-carrier balancing layer 13, whereby the holes and the electrons may recombine both inside the charge-carrier balancing layer 13 and at the interface between the charge-carrier balancing layer 13 and the luminescent layer 12, which may enlarge the area of the recombination between the holes and the electrons, to expand the light emitting region, and increase the luminous efficiency of the device.

In the light-emitting-diode device according to the present embodiment, by providing the charge-carrier balancing layer 13 between the luminescent layer 12 and the electron transporting layer 14, wherein the hole mobility of the charge-carrier balancing layer 13 is greater than the electron mobility of the charge-carrier balancing layer 13, the LUMO energy level of the charge-carrier balancing layer 13 is shallower than the LUMO energy level of the electron transporting layer 14, and the HOMO energy level of the charge-carrier balancing layer 13 is shallower than the HOMO energy level of the luminescent layer 12, the speed of the transportation of the electrons from the electron transporting layer 14 to the luminescent layer 12 may be reduced, to improve the luminous efficiency, the reliability and the life of the device.

Figure 3:
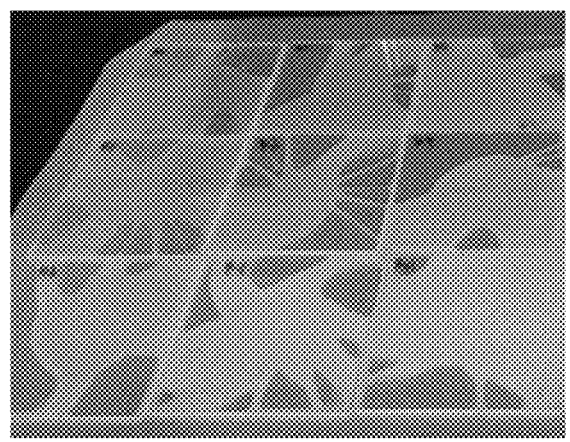
FIG. 3 schematically illustrates a multilayer-film surface of a light emitting base plate in the related art.

Furthermore, in the process of fabricating the light-emitting-diode device, both of the luminescent layer 12 and the electron transporting layer 14 are fabricated by dispersing nanoparticles into a solvent. After the solvents are removed in the film formation, the film layers have a large surface tension. When the multilayer films are stacked, if the electron transporting layer 14 directly covers the luminescent layer 12 or the luminescent layer 12 directly covers the electron transporting layer 14, the problem of an uneven surface easily happens (as shown in FIG. 3), which causes a poor process stability, and thus high requirements on the materials and the processes of the solvent systems.

Figure 4:
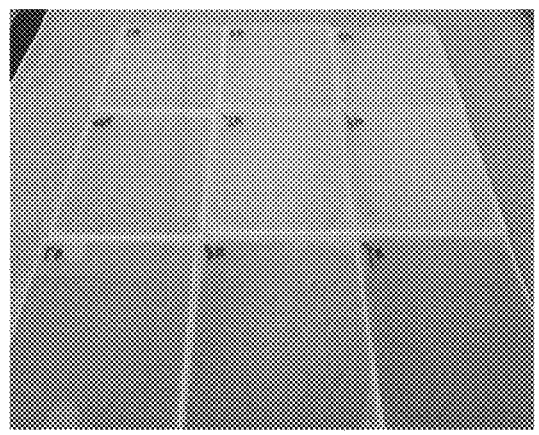
FIG. 4 schematically illustrates a multilayer-film surface of a light emitting base plate according to the present disclosure.

In the present embodiment, by providing the charge-carrier balancing layer 13 between the luminescent layer 12 and the electron transporting layer 14, the charge-carrier balancing layer 13 serves to planarize the surface of the luminescent layer 12 or the electron transporting layer 14. That may alleviate the surface tension of the luminescent layer 12 or the electron transporting layer 14, improve the surface uniformity (as shown in FIG. 4), improve the process stability, broaden the range of selecting the solvent materials, and reduce the requirement on the process precision.

In an alternative implementation, the HOMO energy level of the charge-carrier balancing layer 13 may be shallower than the HOMO energy level of the electron transporting layer 14. Particularly, the HOMO energy level of the charge-carrier balancing layer 13 is higher than the HOMO energy level of the electron transporting layer 14. That may form a migration barrier potential to the holes, to prevent the holes from transporting to the electron transporting layer 14, to increase the luminous efficiency of the device.

In an alternative implementation, the difference between the LUMO energy level of the charge-carrier balancing layer 13 and the LUMO energy level of the electron transporting layer 14 may be greater than or equal to 0.6 eV, and less than or equal to 1.5 eV. In the present implementation, the height of the barrier potential blocking the electron transportation formed between the electron transporting layer 14 and the luminescent layer 12 is greater than or equal to 0.6 eV, and less than or equal to 1.5 eV. That can not only ensure that the transportation barrier potential formed between the luminescent layer 12 and the electron transporting layer 14 can effectively block the electron transportation, to reduce the transporting speed of the electrons, but also can ensure that the electrons can cross the transportation barrier potential and transport from the electron transporting layer 14 to the luminescent layer 12, to prevent the transportation barrier potential from being too high to be crossed by the electrons.

In an alternative implementation, the absolute value of the LUMO energy level of the charge-carrier balancing layer 13 may be greater than or equal to 2.35 eV. Because the LUMO energy level of the charge-carrier balancing layer 13 is a negative value, in the present implementation, the LUMO energy level of the charge-carrier balancing layer 13 may be less than or equal to −2.35 eV. In a particular implementation, the particular numerical value of the LUMO energy level of the charge-carrier balancing layer 13 may be determined according to factors such as the LUMO energy level of the electron transporting layer 14, which is not limited in the present embodiment.

In an alternative implementation, the absolute value of the HOMO energy level of the charge-carrier balancing layer 13 may be less than or equal to 6.3 eV. Because the HOMO energy level of the charge-carrier balancing layer 13 is a negative value, in the present implementation, the HOMO energy level of the charge-carrier balancing layer 13 may be greater than or equal to −6.3 eV. In a particular implementation, the particular numerical value of the HOMO energy level of the charge-carrier balancing layer 13 may be determined according to factors such as the HOMO energy level of the luminescent layer 12 and the HOMO energy level of the electron transporting layer 14, which is not limited in the present embodiment.

Referring to FIG. 1, the light-emitting-diode device may further include a hole transporting layer 16 provided between the anode layer 11 and the luminescent layer 12. The hole transporting layer 16 is mainly used to transport the holes. It may employ a polymer material, such as PVK and TFB, and may also employ an organic small-molecule material whose molecular weight is not greater than 4000. The hole mobility of the hole transporting layer 16 is generally not less than $10^{-6}$ cm$^2$/Vs.

In the related art, in order to prevent generating excess electrons, usually, the electron transporting layer 14 employs a material of a low electron mobility, and the hole transporting layer 16 employs a material of a high hole mobility, which highly narrows the ranges for selecting the materials of the electron transporting layer 14 and the hole transporting layer 16. In the present embodiment, because the provision of the charge-carrier balancing layer 13 can reduce the speed of the transportation of the electrons from the electron transporting layer 14 to the luminescent layer 12, and reduce the difference between the transporting speed of the electrons and the transporting speed of the holes, the ranges for selecting the materials of the film layers such as the electron transporting layer 14 and the hole transporting layer 16 can be broadened.

In an alternative implementation, the luminescent layer 12 may be a quantum-dot luminescent layer, which is not limited in the present embodiment. Accordingly, the light-emitting-diode device can have the advantages such as a high fluorescent quantum yield, a narrow luminescence spectrum and a regulatable luminescence spectrum. The main function of the quantum-dot luminescent layer is to have exciton recombination on the quantum dots to have luminescence. The quantum dots may employ the II-VI group, perovskite, the III-V group, the I-III-VI group, IV-VI, silicon-series quantum dots, carbon quantum dots and so on.

In a particular implementation, the material of the anode layer 11 may be a material having a high work function. When the light-emitting-diode device according to the present embodiment is used for a light emitting base plate, the anode layer 11 may be close to the substrate of the light emitting base plate. If the light emitting base plate is of a bottom-emission structure, then the anode layer 11 may employ a transparent oxide material such as Indium Tin Oxide (ITO) and Indium Zinc Oxide (IZO), and the thickness may be greater than or equal to 80 nanometers, and less than or equal to 200 nanometers. If the light emitting base plate is of a top-emission structure, then the anode layer 11 may be fabricated by using a composite structure of a transparent oxide material and a metal layer such as Ag, for example, Ag/ITO or Ag/IZO. The thickness of the metal layer Ag may be greater than or equal to 80 nanometers and less than or equal to 100 nanometers, and the thickness of the metal oxide may be greater than or equal to 5 nanometers and less than or equal to 10 nanometers. In the top-emission structure, the average reflectivity of the anode layer 11 within the visible-light wave band may be greater than or equal to 85%, and less than or equal to 95%. It should be noted that, when the light-emitting-diode device according to the present embodiment is used for a light emitting base plate, the cathode layer 15 may also be close to the substrate of the light emitting base plate. In such a structure the material of the anode layer 11 may be selected according to practical demands, and is not limited in the present embodiment.

The electron transporting layer 14 mainly serves for the transportation of the electrons. It may employ a metal oxide such as ZnO and ZnMgO, and may also employ a vapor-deposition-type material whose molecular structure contains an electron-withdrawing group such as anthracenes and triazine. The electron mobility of the electron transporting layer 14 may be greater than or equal to $10^{-4}$ cm$^2$/Vs.

As shown in FIG. 1, the light-emitting-diode device may further include a hole injection layer 17 provided between the anode layer 11 and the hole transporting layer 16. The hole injection layer 17 mainly serves to reduce the hole-injection barrier potential, to increase the hole-injection efficiency. It may be fabricated by using the materials such as PSS: PEDOT and NiO$_x$, and may also be fabricated by performing P-type doping to a hole transportation material.

The light-emitting-diode device may further include an electron blocking layer provided between the hole transporting layer 16 and the luminescent layer 12. The electron blocking layer serves to block the migration of the electrons to the hole transporting layer 16.

The light-emitting-diode device may further include a hole blocking layer provided between the charge-carrier balancing layer 13 and the electron transporting layer 14. The hole blocking layer serves to block the migration of the holes to the electron transporting layer 14.

In an alternative implementation, the electron mobility of the charge-carrier balancing layer 13 is less than the electron mobility of the electron transporting layer 14 by no less than 2 orders of magnitude. Particularly, the electron mobility of the charge-carrier balancing layer 13 is lower than the electron mobility of the electron transporting layer 14 by at least 2 orders of magnitude. For example, the order of magnitude of the electron mobility of the charge-carrier balancing layer 13 is $10^{-6}$, and the order of magnitude of the electron mobility of the electron transporting layer 14 may be $10^{-4}$, $10^{-3}$ and so on. The present implementation may further reduce the speed of the transportation of the electrons from the electron transporting layer 14 to the luminescent layer 12, and further reduce the accumulation of the excess electrons at the surface of one side of the luminescent layer 12 that is closer to the anode layer 11, to improve the stability, the reliability and the device performance of the device.

In an alternative implementation, the hole mobility of the hole transporting layer 16 may be greater than the hole mobility of the charge-carrier balancing layer 13 by 1 order of magnitude or less than the hole mobility of the charge-carrier balancing layer 13 by 1 order of magnitude. Particularly, the difference between the orders of magnitude of the hole mobility of the charge-carrier balancing layer 13 and the hole mobility of the hole transporting layer 16 may be within 1 order of magnitude.

In an alternative implementation, the thickness of the charge-carrier balancing layer 13 may be greater than or equal to 2 micrometers, and less than or equal to 40 micrometers. Further, the thickness of the charge-carrier balancing layer 13 may be greater than or equal to 5 micrometers, and less than or equal to 25 micrometers. By selecting the suitable thickness, in an aspect, the transporting speed of the electrons can be effectively reduced, and, in another aspect, it is ensured that the electrons can pass through the charge-carrier balancing layer 13 and enter the luminescent layer 12. In a particular implementation, the thickness of the charge-carrier balancing layer 13 may be determined according to practical demands, and is not limited in the present embodiment.

In an alternative implementation, the material of the charge-carrier balancing layer 13 may include a first compound, wherein the first compound is selected from the compounds represented by the following first general formula:

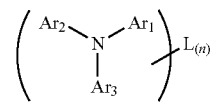

wherein L represents solubilizing groups.

In a particular implementation, the solubilizing groups may be selected from any one of straight-chain alkyl having 2 to 40 carbon atoms, branch-chain alkyl having 2 to 40 carbon atoms, cyclic alkyl having 2 to 40 carbon atoms, straight-chain alkoxy having 2 to 40 carbon atoms, branch-chain alkoxy having 2 to 40 carbon atoms and cyclic alkoxy having 2 to 40 carbon atoms.

Further, the solubilizing groups may be selected from any one of straight-chain alkyl having 2 to 30 carbon atoms, branch-chain alkyl having 2 to 30 carbon atoms, cyclic alkyl having 2 to 30 carbon atoms, straight-chain alkoxy having 2 to 30 carbon atoms, branch-chain alkoxy having 2 to 30 carbon atoms and cyclic alkoxy having 2 to 30 carbon atoms.

Further, the solubilizing groups may be selected from any one of straight-chain alkyl having 2 to 20 carbon atoms, branch-chain alkyl having 2 to 20 carbon atoms, cyclic alkyl having 2 to 20 carbon atoms, straight-chain alkoxy having 2 to 20 carbon atoms, branch-chain alkoxy having 2 to 20 carbon atoms and cyclic alkoxy having 2 to 20 carbon atoms.

Further, the solubilizing groups may be selected from any one of straight-chain alkyl having 2 to 15 carbon atoms, branch-chain alkyl having 2 to 15 carbon atoms, cyclic alkyl having 2 to 15 carbon atoms, straight-chain alkoxy having 2 to 15 carbon atoms, branch-chain alkoxy having 2 to 15 carbon atoms and cyclic alkoxy having 2 to 15 carbon atoms.

Further, the solubilizing groups may be selected from any one of straight-chain alkyl having 3 to 15 carbon atoms, branch-chain alkyl having 3 to 15 carbon atoms, cyclic alkyl having 3 to 15 carbon atoms, straight-chain alkoxy having 3 to 15 carbon atoms, branch-chain alkoxy having 3 to 15 carbon atoms and cyclic alkoxy having 3 to 15 carbon atoms.

The solubilizing groups L may be directly bonded to any site of $Ar_1$, $Ar_2$ and $Ar_3$.

N represents a quantity of the solubilizing groups. In a particular implementation, n may be greater than or equal to 2. In other words, the first compound contains at least two solubilizing groups.

$Ar_1$, $Ar_2$ and $Ar_3$ may be the same or different, and at least one of $Ar_1$, $Ar_2$ and $Ar_3$ is selected from the compounds represented by a second general formula, and the other are selected from the compounds represented by a third general formula. In other words, at least one of $Ar_1$, $Ar_2$ and $Ar_3$ is selected from the compounds represented by the second general formula, and the other are selected from the compounds represented by a third general formula.

In the present implementation, the second general formula may be:

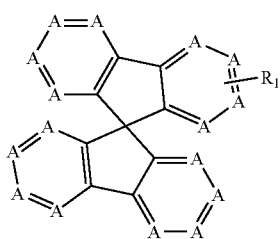

wherein A is selected from nitrogen or carbon.

The third general formula may be any one of the following general formulas:

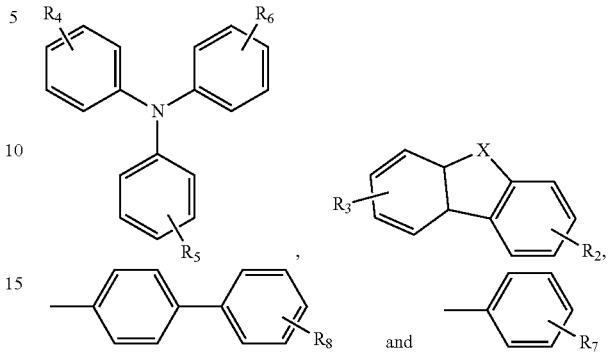

wherein X is selected from nitrogen, carbon, oxygen or sulphur.

$R_1$, $R_2$, $R_3$, $R_4$, $R_5$, $R_6$, $R_7$ and $R_8$ may be the same or different, and are individually independently selected from any one of substituted alkyl having 1 to 30 carbon atoms, unsubstituted alkyl having 1 to 30 carbon atoms, substituted alkoxy having 1 to 30 carbon atoms, unsubstituted alkoxy having 1 to 30 carbon atoms, aryl having 6 to 40 carbon atoms, aryloxy having 6 to 40 carbon atoms and aralkyl having 7 to 40 carbon atoms.

In an alternative implementation, the molecular weight of the first compound may be less than or equal to 5000 g/mol. Further, the molecular weight of the first compound may be less than or equal to 4000 g/mol.

The device performances of the light-emitting-diode devices of several particular structures will be compared below.

In a structure 1, the light-emitting-diode device includes the anode layer 11, the hole injection layer 17, the hole transporting layer 16, the quantum-dot luminescent layer 12, the charge-carrier balancing layer 13, the electron transporting layer 14 and the cathode layer 15 that are arranged in stack. The material of the anode layer 11 is ITO, and its thickness is greater than or equal to 40 nanometers and less than or equal to 45 nanometers. The thickness of the hole injection layer 17 is greater than or equal to 35 nanometers and less than or equal to 40 nanometers. The thickness of the hole transporting layer 16 is greater than or equal to 35 nanometers and less than or equal to 40 nanometers. The thickness of the luminescent layer 12 is greater than or equal to 10 nanometers and less than or equal to 20 nanometers. The thickness of the charge-carrier balancing layer 13 is 5 nanometers. The thickness of the electron transporting layer 14 is greater than or equal to 30 nanometers and less than or equal to 60 nanometers. The material of the cathode layer 15 is the metal aluminum, and its thickness is 100 nanometers.

In a particular implementation, the hole injection layer 17 may be fabricated by using a PEDOT solution. The hole transporting layer 16 may be fabricated by using a PVK solution. The quantum-dot luminescent layer 12 may be fabricated by using a CdSe red-light quantum-dot solution, wherein the material parameters of the quantum-dot luminescent layer 12 are shown by the EML material in Table 1. The charge-carrier balancing layer 13 may be fabricated by using an A1 solution, wherein the material parameters of the charge-carrier balancing layer 13 are shown by the compound A1 material in Table 1. The electron transporting layer 14 is fabricated by using a ZnO solution, wherein the material parameters of the electron transporting layer 14 are shown by the ETL material in Table 1. Optionally, the particular fabricating process is as follows:

treating a washed glass base plate loaded with the anode layer 11 by using an ultraviolet ozone washing machine for 15 min, transferring into a glove box filled with nitrogen protection, spin-coating a PEDOT solution at a rotational speed of 3000 rpm for a spin-coating duration of 40 s, baking at 130° C. for 20 min, and placing at room temperature, to form the hole injection layer 17; subsequently spin-coating a premixed PVK solution onto the hole injection layer 17 at a rotational speed of 3000 rpm for a spin-coating duration of 40 s, and baking at 130° C. for 20 min, to form the hole transporting layer 16; subsequently spin-coating a CdSe red-light quantum-dot solution onto; the hole transporting layer 16 at a rotational speed of 4000 rpm for a spin-coating duration of 40 s, and annealing at 100° C. for 10 min, to form the quantum-dot luminescent layer 12; subsequently spin-coating an Al solution onto the quantum-dot luminescent layer 12 at a rotational speed of 3000 rpm for a spin-coating duration of 40 s, and baking at 130° C. for 20 min, to form the charge-carrier balancing layer 13; subsequently spin-coating a ZnO solution onto the charge-carrier balancing layer 13 at a rotational speed of 3000 rpm for 40 s, and baking at 100° C. for 10 min, to form the electron transporting layer 14; and subsequently vapor-depositing aluminum onto the electron transporting layer 14 as the cathode. The anode layer of the light-emitting-diode device fabricated by using the above fabricating process is close to the glass base plate, and the light-emitting-diode device is of an upright-placing structure, as shown in FIG. 1.

In a particular implementation, the cathode layer 15, the electron transporting layer 14, the charge-carrier balancing layer 13, the luminescent layer 12, the hole transporting layer 16, the hole injection layer 17 and the anode layer 11 may also be sequentially formed on the glass base plate. The fabricating processes of the layers may refer to the above-described process parameters, and are not discussed further herein. A light-emitting-diode device in which the cathode layer 15 is close to the glass base plate is finally fabricated, and the light-emitting-diode device is of an inverse-placing structure. The upright-placing or inverse-placing structure of the light-emitting-diode device is not particularly limited in the present embodiment.

In a structure 2, the thickness of the charge-carrier balancing layer 13 is 15 nanometers, and the others are the same as those of the structure 1.

In a structure 3, the thickness of the charge-carrier balancing layer 13 is 30 nanometers, and the others are the same as those of the structure 1.

In a structure 4, the thickness of the charge-carrier balancing layer 13 is 15 nanometers, the material parameters of the charge-carrier balancing layer 13 are shown by the A2 material in Table 1, and the others are the same as those of the structure 1.

In a comparative structure 1, the charge-carrier balancing layer 13 is removed based on the structure 1, and the others are the same as those of the structure 1.

In a comparative structure 2, a functional layer is provided between the luminescent layer 12 and the electron transporting layer 14, with the material of PVK and the thickness of 20 nm, and the others are the same as those of the structure 1. The material parameters of the functional layer are shown by the PVK material in Table 1. The general formula of the PVK material is as follows:

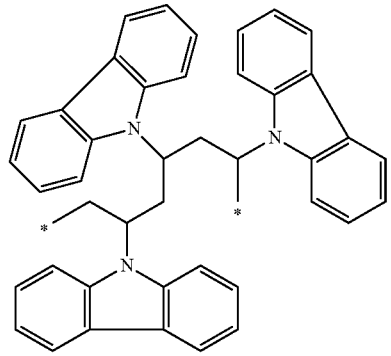

TABLE 1

| Material | HOMO energy level | LUMO energy level | Hole mobility | Electron mobility |
|---|---|---|---|---|
| Compound A1 | −5.4 eV | −2.6 eV | 5.1*10⁻⁴ | 9.3*10⁻⁶ |
| Compound A2 | −5.6 eV | −2.5 eV | 1.2*10⁻⁴ | 4.6*10⁻⁶ |
| PVK | −5.8 eV | −2.2 eV | 4.8*10⁻⁶ | — |
| EML | −6.1 eV | −3.7 eV | — | — |
| ETL | −7.0 eV | −3.6 eV | — | 1.8*10⁻³ |

In Table 1, PVK is a hole-type material, and therefore merely the hole mobility is shown. The material ETL of the electron transporting layer 14 is an electron-type material, and therefore merely the electron mobility is shown. The material of the charge-carrier balancing layer 13, for example, the compound A1 or the compound A2, is substantially a hole-type material, whose electron mobility is less than the hole mobility. It should be noted that both of the compound A1 and the compound A2 are the first compound.

By testing the current-voltage-brightness characteristics of the devices of the above several structures, the test result is shown in Table 2.

TABLE 2

| Device | Voltage (V) | Current efficiency (cd/A) | EL (nm) | FHWM (nm) |
|---|---|---|---|---|
| Comparative structure 1 | 2.56 | 8.3 | 624 | 24 |
| Comparative structure 2 | 3.53 | 13.1 | 624 | 24 |
| Structure 1 | 2.64 | 14.2 | 624 | 24 |
| Structure 2 | 2.85 | 20.4 | 624 | 24 |
| Structure 3 | 3.16 | 15.6 | 624 | 24 |
| Structure 4 | 2.93 | 18.9 | 624 | 24 |

It can be seen from Table 2 that, as compared with the comparative structure 1 not provided with the charge-carrier balancing layer 13, the current efficiencies of the structure 1 to the structure 4 that are provided with the charge-carrier balancing layer 13 are obviously increased, but the voltages are slightly increased. That is because, after the charge-carrier balancing layer 13 is added, the transportation barrier potential of the electrons from the electron transporting layer 14 to the luminescent layer 12 is increased, which reduces the transporting speed of the electrons to a certain extent, alleviates the accumulation of the excess electrons at the interface between the hole transporting layer 16 and the luminescent layer 12, and balances the charge carriers in the luminescent layer 12, whereby the device performance can be improved.

It can be seen from Table 1 and Table 2 that, in the comparative structure 2, because PVK has a shallower LUMO energy level, or, in other words, the LUMO energy level of PVK (−2.2 eV) is higher than the LUMO energy level of the compound A1 (−2.6 eV) and the LUMO energy level of the compound A2 (−2.5 eV), the transportation barrier potential between the electron transporting layer 14 and the luminescent layer 12 is excessively high, which causes that the voltage seriously rises, and the current efficiency is far less than those of the structure 1 to the structure 4.

From the structure 1 to the structure 3, the thickness of the charge-carrier balancing layer 13 is adjusted into 5 nanometers, 15 nanometers and 30 nanometers respectively. It can be seen from Table 2 that, with the increasing in the thickness of the charge-carrier balancing layer 13, the voltage gradually increases, and the current efficiency firstly increases and subsequently decreases. That is because, at the initial stage of the increasing in the thickness of the charge-carrier balancing layer 13, the transportation barrier potential of the electrons increases, the transporting speed of the electrons decreases, and the electron and hole recombination can happen inside both of the luminescent layer 12 and the charge-carrier balancing layer 13, at which point the luminous efficiency of the device can be increased. However, after the luminous efficiency reaches a certain critical value, if the thickness of the charge-carrier balancing layer 13 is continuously increased, that might result in an excessively high electron transportation barrier potential, whereby the electrons cannot be transported into the luminescent layer, which causes that the voltage rises and the luminous efficiency decreases.

By comparing the structure 2 and the structure 4, the thicknesses of the charge-carrier balancing layer 13 are equal, and the materials of the charge-carrier balancing layer 13 are the compound A1 and the compound A2 respectively. It can be seen from Table 2 that the structure 2 has a lower voltage and a higher current efficiency. That is because the barrier potential of the interface between the compound A1 and the electron transporting layer 14 is less than the barrier potential of the interface between the compound A2 and the electron transporting layer 14, and the electron mobility and the hole mobility of the compound A1 are higher. Therefore, when the material of the charge-carrier balancing layer 13 is the compound A1, the light-emitting-diode device can have a lower voltage and a higher current efficiency.

Figure 5:
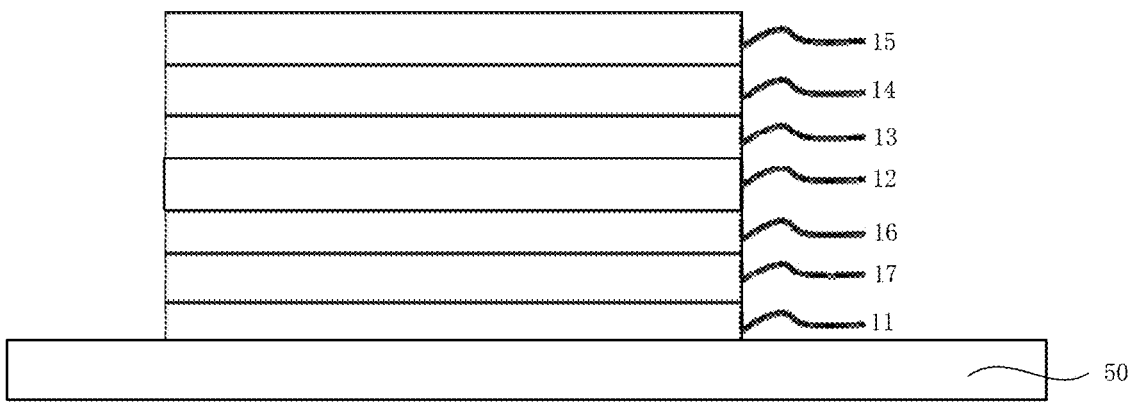
FIG. 5 schematically illustrates a schematic sectional structural diagram of a light emitting base plate according to the present disclosure.
Figure 6:
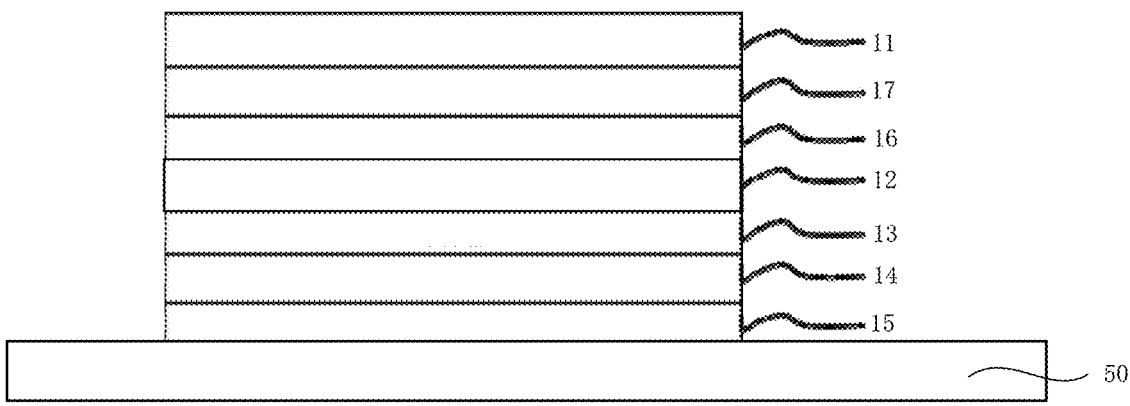
FIG. 6 schematically illustrates a schematic sectional structural diagram of another light emitting base plate according to the present disclosure.

An embodiment of the present disclosure provides a light emitting base plate. Referring to FIGS. 5 and 6, the light emitting base plate includes: a substrate 50, and a plurality of the light-emitting-diode devices according to any one of the above embodiments that are provided on one side of the substrate 50.

The light-emitting-diode device includes an anode layer 11, a luminescent layer 12, a charge-carrier balancing layer 13, an electron transporting layer 14 and a cathode layer 15 that are arranged in stack on one side of the substrate 50.

In an alternative implementation, referring to FIG. 5, the anode layer 11 may be close to the substrate 50. As shown in FIG. 5, a hole injection layer 17 and a hole transporting layer 16 may be arranged in stack between the anode layer 11 and the luminescent layer 12, the hole injection layer 17 is close to the anode layer 11, and the luminescent layer 12 is provided on one side of the hole transporting layer 16 that is away from the anode layer 11.

In another alternative implementation, referring to FIG. 6, the cathode layer 15 may be close to the substrate 50. As shown in FIG. 6, a hole transporting layer 16 and a hole injection layer 17 may be arranged in stack between the luminescent layer 12 and the anode layer 11, the hole transporting layer 16 is close to the luminescent layer 12, and the anode layer 11 is provided on one side of the hole injection layer 17 that is away from the luminescent layer 12.

A driving circuit connected to the light-emitting-diode devices may be provided at the light emitting base plate according to the present embodiment. The driving circuit may be connected to a controlling circuit, to, according to an electric signal inputted by the controlling circuit, drive the light-emitting-diode devices to emit light. The driving circuit may be an active driving circuit or a passive driving circuit.

In the present example, the light emitting base plate may be used for illumination, i.e., applied in an illuminating device. It may also be used for displaying; in other words, it may be applied in a light emitting apparatus.

Another embodiment of the present disclosure further provides a light emitting apparatus. The light emitting apparatus may include the light emitting base plate according to any one of the above embodiments.

In some embodiments, the light emitting apparatus may be an illuminating device. In this case, the light emitting apparatus serves as a light source, to realize the function of illumination. For example, the light emitting apparatus may be a backlight module in a liquid-crystal displaying device, a lamp for internal illumination or external illumination, or various signal lamps.

In some other embodiments, the light emitting apparatus may be a displaying device. In this case, the light emitting base plate is a displaying base plate, and is used to realize the function of displaying images (i.e., frames). The light emitting apparatus may include a display or a product including a display. The display may be a Flat Panel Display (FPD), a microdisplay and so on. If classified based on whether the user can see the scene at the back face of the display, the display may be a transparent display or a non-transparent display. If classified based on whether the display can be bent or curled, the display may be a flexible display or a common display (which may be referred to as a rigid display). As an example, the product including a display may include: a computer display, a television set, a billboard, a laser printer having the function of displaying, a telephone, a mobile phone, a Personal Digital Assistant (PDA), a laptop computer, a digital camera, a portable camcorder, a viewfinder, a vehicle, a large-area wall, a theater screen, a stadium scutcheon and so on.

Another embodiment of the present disclosure further provides a fabricating method of a light-emitting-diode device, wherein the fabricating method includes: sequentially forming an anode layer, a luminescent layer, a charge-carrier balancing layer, an electron transporting layer and a cathode layer; or sequentially forming a cathode layer, an electron transporting layer, a charge-carrier balancing layer, a luminescent layer and an anode layer.

The hole mobility of the charge-carrier balancing layer is greater than the electron mobility of the charge-carrier balancing layer, the LUMO energy level of the charge-carrier balancing layer is shallower than the LUMO energy level of the electron transporting layer, and the HOMO energy level of the charge-carrier balancing layer is shallower than the HOMO energy level of the luminescent layer.

By using the fabricating method according to the present embodiment, the light-emitting-diode device according to any one of the above embodiments can be fabricated.

In an alternative implementation, the step of sequentially forming the anode layer, the luminescent layer, the charge-carrier balancing layer, the electron transporting layer and the cathode layer may include: sequentially forming the anode layer and the luminescent layer; subsequently, spin-coating a solution of a first compound onto one side of the luminescent layer that is opposite to the anode layer, and drying the solution of the first compound, to form the charge-carrier balancing layer; and subsequently, sequentially forming the electron transporting layer and the cathode layer on one side of the charge-carrier balancing layer that is opposite to the anode layer.

The step of sequentially forming the anode layer and the luminescent layer may include: firstly, forming the anode layer; subsequently, forming the hole transporting layer on one side of the anode layer; and subsequently, forming the luminescent layer on one side of the hole transporting layer that is opposite to the anode layer. The hole mobility of the hole transporting layer is greater than the hole mobility of the charge-carrier balancing layer by 1 order of magnitude or less than the hole mobility of the charge-carrier balancing layer by 1 order of magnitude.

In a particular implementation, the step of forming the hole transporting layer on one side of the anode layer may further include: forming the hole injection layer on one side of the anode layer, and forming the hole transporting layer on one side of the hole injection layer that is opposite to the anode layer.

A particular process of fabricating the light-emitting-diode device will be given below:

treating a washed glass base plate loaded with the anode layer 11 by using an ultraviolet ozone washing machine for 15 min, transferring into a glove box filled with nitrogen protection, spin-coating a PEDOT solution at a rotational speed of 3000 rpm for a spin-coating duration of 40 s, baking at 130° C. for 20 min, and placing at room temperature, to form the hole injection layer 17; subsequently spin-coating a premixed PVK solution onto the hole injection layer 17 at a rotational speed of 3000 rpm for a spin-coating duration of 40 s, and baking at 130° C. for 20 min, to form the hole transporting layer 16; subsequently spin-coating a CdSe red-light quantum-dot solution onto the hole transporting layer 16 at a rotational speed of 4000 rpm for a spin-coating duration of 40 s, and annealing at 100° C. for 10 min, to form the quantum-dot luminescent layer 12; subsequently spin-coating an Al solution onto the quantum-dot luminescent layer 12 at a rotational speed of 3000 rpm for a spin-coating duration of 40 s, and baking at 130° C. for 20 min, to form the charge-carrier balancing layer 13; subsequently spin-coating a ZnO solution onto the charge-carrier balancing layer 13 at a rotational speed of 3000 rpm for 40 s, and baking at 100° C. for 10 min, to form the electron transporting layer 14; and subsequently vapor-depositing aluminum onto the electron transporting layer 14 as the cathode. The light-emitting-diode device of the upright-placing structure can be fabricated by using the fabricating method according to the present implementation, as shown in FIG. 1.

In an alternative implementation, the step of sequentially forming the cathode layer, the electron transporting layer, the charge-carrier balancing layer, the luminescent layer and the anode layer may include: sequentially forming the cathode layer and the electron transporting layer; spin-coating the solution of the first compound onto one side of the electron transporting layer that is opposite to the cathode layer, and drying the solution of the first compound, to form the charge-carrier balancing layer; and sequentially forming the luminescent layer and the anode layer on one side of the charge-carrier balancing layer that is opposite to the cathode layer.

The step of sequentially forming the luminescent layer and the anode layer on the one side of the charge-carrier balancing layer that is opposite to the cathode layer may include: forming the luminescent layer on one side of the charge-carrier balancing layer that is opposite to the cathode layer; forming the hole transporting layer on one side of the luminescent layer that is opposite to the charge-carrier balancing layer; and forming the anode layer on one side of the hole transporting layer that is opposite to the charge-carrier balancing layer. The hole mobility of the hole transporting layer is greater than the hole mobility of the charge-carrier balancing layer by 1 order of magnitude or less than the hole mobility of the charge-carrier balancing layer by 1 order of magnitude.

In a particular implementation, the step of forming the anode layer on the side of the hole transporting layer that is opposite to the charge-carrier balancing layer may further include: forming the hole injection layer on one side of the hole transporting layer that is opposite to the charge-carrier balancing layer, and forming the anode layer on one side of the hole injection layer that is opposite to the charge-carrier balancing layer.

In the present implementation, the fabricating processes of the layers may refer to the above implementation, and are not discussed further herein. By using the fabricating method according to the present implementation, the light-emitting-diode device of the inverse-placing structure can be fabricated.

The first compound may be selected from the compounds represented by the following first general formula:

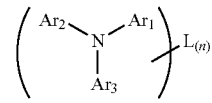

wherein L represents solubilizing groups.

In a particular implementation, the solubilizing groups may be selected from any one of straight-chain alkyl having 2 to 40 carbon atoms, branch-chain alkyl having 2 to 40 carbon atoms, cyclic alkyl having 2 to 40 carbon atoms, straight-chain alkoxy having 2 to 40 carbon atoms, branch-chain alkoxy having 2 to 40 carbon atoms and cyclic alkoxy having 2 to 40 carbon atoms.

Further, the solubilizing groups may be selected from any one of straight-chain alkyl having 2 to 30 carbon atoms, branch-chain alkyl having 2 to 30 carbon atoms, cyclic alkyl having 2 to 30 carbon atoms, straight-chain alkoxy having 2 to 30 carbon atoms, branch-chain alkoxy having 2 to 30 carbon atoms and cyclic alkoxy having 2 to 30 carbon atoms.

Further, the solubilizing groups may be selected from any one of straight-chain alkyl having 2 to 20 carbon atoms, branch-chain alkyl having 2 to 20 carbon atoms, cyclic alkyl having 2 to 20 carbon atoms, straight-chain alkoxy having 2 to 20 carbon atoms, branch-chain alkoxy having 2 to 20 carbon atoms and cyclic alkoxy having 2 to 20 carbon atoms.

Further, the solubilizing groups may be selected from any one of straight-chain alkyl having 2 to 15 carbon atoms, branch-chain alkyl having 2 to 15 carbon atoms, cyclic alkyl having 2 to 15 carbon atoms, straight-chain alkoxy having 2 to 15 carbon atoms, branch-chain alkoxy having 2 to 15 carbon atoms and cyclic alkoxy having 2 to 15 carbon atoms.

Further, the solubilizing groups may be selected from any one of straight-chain alkyl having 3 to 15 carbon atoms, branch-chain alkyl having 3 to 15 carbon atoms, cyclic alkyl having 3 to 15 carbon atoms, straight-chain alkoxy having 3 to 15 carbon atoms, branch-chain alkoxy having 3 to 15 carbon atoms and cyclic alkoxy having 3 to 15 carbon atoms.

The solubilizing groups L may be directly bonded to any site of $Ar_1$, $Ar_2$ and $Ar_3$.

N represents a quantity of the solubilizing groups. In a particular implementation, n may be greater than or equal to 2. In other words, the first compound contains at least two solubilizing groups.

$Ar_1$, $Ar_2$ and $Ar_3$ may be the same or different, and at least one of $Ar_1$, $Ar_2$ and $Ar_3$ is selected from the compounds represented by a second general formula, and the other are selected from the compounds represented by a third general formula. In the present implementation, the second general formula may be:

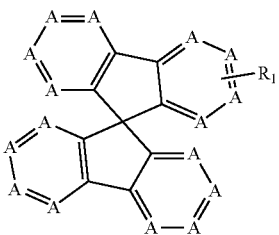

wherein A is selected from nitrogen or carbon.

The third general formula may be any one of the following general formulas:

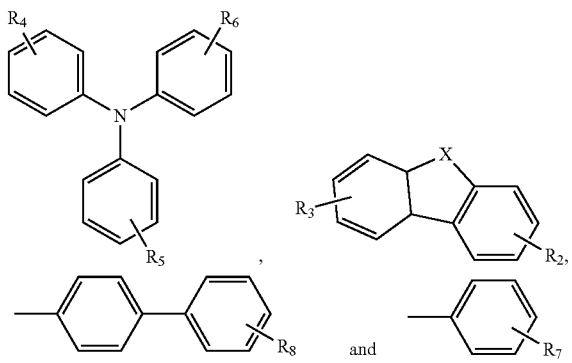

wherein X is selected from nitrogen, carbon, oxygen or sulphur.

$R_1$, $R_2$, $R_3$, $R_4$, $R_5$, $R_6$, $R_7$ and $R_8$ may be the same or different, and are individually independently selected from any one of substituted alkyl having 1 to 30 carbon atoms, unsubstituted alkyl having 1 to 30 carbon atoms, substituted alkoxy having 1 to 30 carbon atoms, unsubstituted alkoxy having 1 to 30 carbon atoms, aryl having 6 to 40 carbon atoms, aryloxy having 6 to 40 carbon atoms and aralkyl having 7 to 40 carbon atoms.

The molecular weight of the first compound may be less than or equal to 5000 g/mol. Further, the molecular weight of the first compound may be less than or equal to 4000 g/mol.

The embodiments of the description are described in the mode of progression, each of the embodiments emphatically describes the differences from the other embodiments, and the same or similar parts of the embodiments may refer to each other.

Finally, it should also be noted that, in the present text, relation terms such as first and second are merely intended to distinguish one entity or operation from another entity or operation, and that does not necessarily require or imply that those entities or operations have therebetween any such actual relation or order. Furthermore, the terms "include", "comprise" or any variants thereof are intended to cover non-exclusive inclusions, so that processes, methods, articles or devices that include a series of elements do not only include those elements, but also include other elements that are not explicitly listed, or include the elements that are inherent to such processes, methods, articles or devices. Unless further limitation is set forth, an element defined by the wording "comprising a . . . " does not exclude additional same element in the process, method, article or device comprising the element.

The light-emitting-diode device and the fabricating method thereof, the light emitting base plate and the light emitting apparatus according to the present disclosure have been described in detail above. The principle and the embodiments of the present disclosure are described herein with reference to the particular examples, and the description of the above embodiments is merely intended to facilitate to comprehend the method according to the present disclosure and its core concept. Moreover, for a person skilled in the art, according to the concept of the present disclosure, the particular embodiments and the range of application may be varied. In conclusion, the contents of the description should not be understood as limiting the present disclosure.

A person skilled in the art, after considering the description and implementing the invention disclosed herein, will readily envisage other embodiments of the present disclosure. The present disclosure aims at encompassing any variations, uses or adaptative alternations of the present disclosure, wherein those variations, uses or adaptative alternations follow the general principle of the present disclosure and include common knowledge or common technical means in the art that are not disclosed by the present disclosure. The description and the embodiments are merely deemed as exemplary, and the true scope and spirit of the present disclosure are presented by the following claims.

It should be understood that the present disclosure is not limited to the accurate structure that has been described above and shown in the drawings, and may have various modifications and variations without departing from its scope. The scope of the present disclosure is merely limited by the appended claims.

The "one embodiment", "an embodiment" or "one or more embodiments" as used herein means that particular features, structures or characteristics described with reference to an embodiment are included in at least one embodiment of the present disclosure. Moreover, it should be noted that here an example using the wording "in an embodiment" does not necessarily refer to the same one embodiment.

The description provided herein describes many concrete details. However, it can be understood that the embodiments of the present disclosure may be implemented without those concrete details. In some of the embodiments, well-known processes, structures and techniques are not described in detail, so as not to affect the understanding of the description.

In the claims, any reference signs between parentheses should not be construed as limiting the claims. The word "comprise" does not exclude elements or steps that are not listed in the claims. The word "a" or "an" preceding an element does not exclude the existing of a plurality of such elements. The present disclosure may be implemented by means of hardware comprising several different elements and by means of a properly programmed computer. In unit claims that list several devices, some of those devices may be embodied by the same item of hardware. The words first, second, third and so on do not denote any order. Those words may be interpreted as names.

Finally, it should be noted that the above embodiments are merely intended to explain the technical solutions of the present disclosure, and not to limit them. Although the present disclosure is explained in detail with reference to the above embodiments, a person skilled in the art should understand that he can still modify the technical solutions set forth by the above embodiments, or make equivalent substitutions to part of the technical features of them. However, those modifications or substitutions do not make the essence of the corresponding technical solutions depart from the spirit and scope of the technical solutions of the embodiments of the present disclosure.

The invention claimed is:

1. A light-emitting-diode device, wherein the light-emitting-diode comprises:
   an anode layer, a luminescent layer, a charge-carrier balancing layer, an electron transporting layer and a cathode layer that are arranged in stack; and
   a hole mobility of the charge-carrier balancing layer is greater than an electron mobility of the charge-carrier balancing layer, an LUMO energy level of the charge-carrier balancing layer is shallower than an LUMO energy level of the electron transporting layer, and a HOMO energy level of the charge-carrier balancing layer is shallower than a HOMO energy level of the luminescent layer.

2. The light-emitting-diode device according to claim 1, wherein the HOMO energy level of the charge-carrier balancing layer is shallower than a HOMO energy level of the electron transporting layer.

3. The light-emitting-diode device according to claim 2, wherein a difference between the LUMO energy level of the charge-carrier balancing layer and the LUMO energy level of the electron transporting layer is greater than or equal to 0.6 eV, and less than or equal to 1.5 eV.

4. The light-emitting-diode device according to claim 2, wherein the electron mobility of the charge-carrier balancing layer is less than an electron mobility of the electron transporting layer by no less than 2 orders of magnitude.

5. The light-emitting-diode device according to claim 1, wherein a difference between the LUMO energy level of the charge-carrier balancing layer and the LUMO energy level of the electron transporting layer is greater than or equal to 0.6 eV, and less than or equal to 1.5 eV.

6. The light-emitting-diode device according to claim 1, wherein the electron mobility of the charge-carrier balancing layer is less than an electron mobility of the electron transporting layer by no less than 2 orders of magnitude.

7. The light-emitting-diode device according to claim 1, wherein the light-emitting-diode device further comprises a hole transporting layer provided between the anode layer and the luminescent layer, and a hole mobility of the hole transporting layer is greater than the hole mobility of the charge-carrier balancing layer by 1 order of magnitude or less than the hole mobility of the charge-carrier balancing layer by 1 order of magnitude.

8. The light-emitting-diode device according to claim 1, wherein an absolute value of the LUMO energy level of the charge-carrier balancing layer is greater than or equal to 2.35 eV, and an absolute value of the HOMO energy level of the charge-carrier balancing layer is less than or equal to 6.3 eV.

9. The light-emitting-diode device according to claim 1, wherein a material of the charge-carrier balancing layer comprises a first compound, wherein the first compound is selected from compounds represented by the following first general formula:

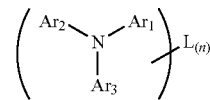

wherein $L_{(n)}$ represents solubilizing groups;
n represents a quantity of the solubilizing groups, wherein n is greater than or equal to 2; and
$Ar_1$, $Ar_2$ and $Ar_3$ are the same or different, wherein at least one of $Ar_1$, $Ar_2$ and $Ar_3$ is selected from compounds represented by a second general formula, and the other are selected from compounds represented by a third general formula;
the second general formula is:

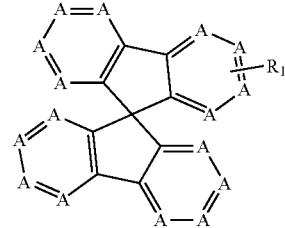

wherein A is selected from nitrogen or carbon; and
the third general formula is any one of the following general formulas:

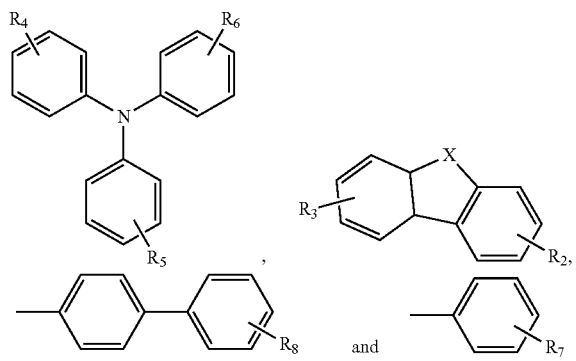

wherein X is selected from N, C, O or S; and
$R_1$, $R_2$, $R_3$, $R_4$, $R_5$, $R_6$, $R_7$ and $R_8$ are the same or different, and are individually independently selected from any one of substituted alkyl having 1 to 30 carbon atoms, unsubstituted alkyl having 1 to 30 carbon atoms, substituted alkoxy having 1 to 30 carbon atoms, unsubstituted alkoxy having 1 to 30 carbon atoms, aryl having 6 to 40 carbon atoms, aryloxy having 6 to 40 carbon atoms and aralkyl having 7 to 40 carbon atoms.

10. The light-emitting-diode device according to claim 9, wherein the solubilizing groups are selected from any one of straight-chain alkyl having 2 to 40 carbon atoms, branch-chain alkyl having 2 to 40 carbon atoms, cyclic alkyl having 2 to 40 carbon atoms, straight-chain alkoxy having 2 to 40 carbon atoms, branch-chain alkoxy having 2 to 40 carbon atoms and cyclic alkoxy having 2 to 40 carbon atoms.

11. The light-emitting-diode device according to claim 9, wherein a molecular weight of the first compound is less than or equal to 5000 g/mol.

12. The light-emitting-diode device according to claim 11, wherein the molecular weight of the first compound is less than or equal to 4000 g/mol.

13. The light-emitting-diode device according to claim 1, wherein a thickness of the charge-carrier balancing layer is greater than or equal to 2 micrometers, and less than or equal to 40 micrometers.

14. The light-emitting-diode device according to claim 13, wherein the thickness of the charge-carrier balancing layer is greater than or equal to 5 micrometers, and less than or equal to 25 micrometers.

15. The light-emitting-diode device according to claim 1, wherein the luminescent layer is a quantum-dot luminescent layer.

16. A light emitting base plate, wherein the light emitting base plate comprises:
a substrate, and a plurality of the light-emitting-diode devices according to claim 1 that are provided on one side of the substrate, wherein the anode layer or the cathode layer is close to the substrate.

17. A light emitting apparatus, wherein the light emitting apparatus comprises the light emitting base plate according to claim 16.

18. A fabricating method of a light-emitting-diode device, wherein the fabricating method comprises:
sequentially forming an anode layer, a luminescent layer, a charge-carrier balancing layer, an electron transporting layer and a cathode layer; or
sequentially forming a cathode layer, an electron transporting layer, a charge-carrier balancing layer, a luminescent layer and an anode layer;
wherein a hole mobility of the charge-carrier balancing layer is greater than an electron mobility of the charge-carrier balancing layer, an LUMO energy level of the charge-carrier balancing layer is shallower than an LUMO energy level of the electron transporting layer, and a HOMO energy level of the charge-carrier balancing layer is shallower than a HOMO energy level of the luminescent layer.

19. The fabricating method according to claim 18, wherein the step of sequentially forming the anode layer, the luminescent layer, the charge-carrier balancing layer, the electron transporting layer and the cathode layer comprises:
sequentially forming the anode layer and the luminescent layer;
spin-coating a solution of a first compound onto one side of the luminescent layer that is away from the anode layer, and drying the solution of the first compound, to form the charge-carrier balancing layer; and sequentially forming the electron transporting layer and the cathode layer on one side of the charge-carrier balancing layer that is away from the anode layer; and
the step of sequentially forming the cathode layer, the electron transporting layer, the charge-carrier balancing layer, the luminescent layer and the anode layer comprises:
sequentially forming the cathode layer and the electron transporting layer;
spin-coating the solution of the first compound onto one side of the electron transporting layer that is away from the cathode layer, and drying the solution of the first compound, to form the charge-carrier balancing layer; and
sequentially forming the luminescent layer and the anode layer on one side of the charge-carrier balancing layer that is away from the cathode layer;
wherein the first compound is selected from compounds represented by the following first general formula:

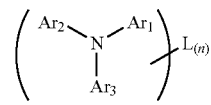

wherein $L_{(n)}$ represents solubilizing groups;
n represents a quantity of the solubilizing groups, wherein n is greater than or equal to 2; and
$Ar_1$, $Ar_2$ and $Ar_3$ are the same or different, wherein at least one of $Ar_1$, $Ar_2$ and $Ar_3$ is selected from compounds represented by a second general formula, and the other are selected from compounds represented by a third general formula;
the second general formula is:

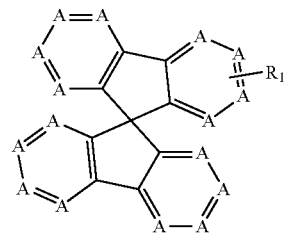

wherein A is selected from nitrogen or carbon; and
the third general formula is any one of the following general formulas:

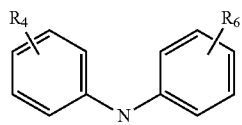

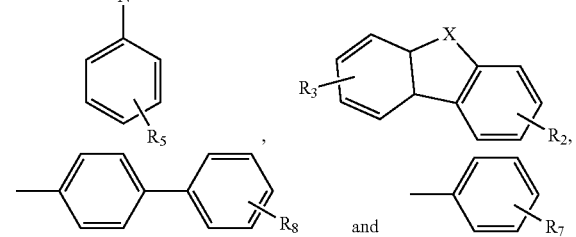

wherein X is selected from N, C, O or S; and $R_1$, $R_2$, $R_3$, RA, $R_5$, $R_6$, $R_7$ and $R_8$ are the same or different, and are individually independently selected from any one of substituted alkyl having 1 to 30 carbon atoms, unsubstituted alkyl having 1 to 30 carbon atoms, substituted alkoxy having 1 to 30 carbon atoms, unsubstituted alkoxy having 1 to 30 carbon atoms, aryl having 6 to 40 carbon atoms, aryloxy having 6 to 40 carbon atoms and aralkyl having 7 to 40 carbon atoms.

20. The fabricating method according to claim 19, wherein the step of sequentially forming the anode layer and the luminescent layer comprises:

forming the anode layer;

forming the hole transporting layer on one side of the anode layer; and forming the luminescent layer on one side of the hole transporting layer that is away from the anode layer; and the step of sequentially forming the luminescent layer and the anode layer on the one side of the charge-carrier balancing layer that is away from the cathode layer comprises:

forming the luminescent layer on one side of the charge-carrier balancing layer that is away from the cathode layer;

forming the hole transporting layer on one side of the luminescent layer that is away from the charge-carrier balancing layer; and forming the anode layer on one side of the hole transporting layer that is away from the charge-carrier balancing layer;

wherein a hole mobility of the hole transporting layer is greater than the hole mobility of the charge-carrier balancing layer by 1 order of magnitude or less than the hole mobility of the charge-carrier balancing layer by 1 order of magnitude.

\* \* \* \* \*